(12) United States Patent
Okayasu et al.

(10) Patent No.: US 10,734,508 B2
(45) Date of Patent: Aug. 4, 2020

(54) COMPOUND SEMICONDUCTOR DEVICE

(71) Applicant: ADVANTEST CORPORATION, Nerima-ku, Tokyo (JP)

(72) Inventors: Jun'ichi Okayasu, Tokyo (JP); Taku Sato, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/710,233

(22) Filed: Sep. 20, 2017

(65) Prior Publication Data

US 2018/0138302 A1 May 17, 2018

(30) Foreign Application Priority Data

Nov. 16, 2016 (JP) .................. 2016-223426

(51) Int. Cl.
| | |
|---|---|
| *H01L 29/778* | (2006.01) |
| *H01L 29/06* | (2006.01) |
| *H01L 29/66* | (2006.01) |
| *H01L 23/29* | (2006.01) |
| *H01L 21/8252* | (2006.01) |
| *H01L 23/31* | (2006.01) |
| *H01L 27/095* | (2006.01) |
| *H01L 29/20* | (2006.01) |
| *H01L 21/8234* | (2006.01) |

(52) U.S. Cl.
CPC ........ *H01L 29/778* (2013.01); *H01L 21/8252* (2013.01); *H01L 23/291* (2013.01); *H01L 23/3171* (2013.01); *H01L 27/095* (2013.01); *H01L 29/0607* (2013.01); *H01L 29/66462* (2013.01); *H01L 29/7786* (2013.01); *H01L 21/823456* (2013.01); *H01L 29/2003* (2013.01)

(58) Field of Classification Search
None
See application file for complete search history.

(56) References Cited

U.S. PATENT DOCUMENTS 8,178,900 B2 * 5/2012 Kurachi .............. H01L 29/7787
257/183
2014/0159050 A1 6/2014 Yoon et al.

FOREIGN PATENT DOCUMENTS

| JP | 2009507396 A | 2/2009 |
|---|---|---|
| JP | 2014011292 A | 1/2014 |
| JP | 2015230972 A | 12/2015 |
| TW | 201403814 A | 1/2014 |
| TW | 201409941 A | 3/2014 |

OTHER PUBLICATIONS

JPO Notification of Reason(s) for Refusal corresponding to JP Patent Application No. 2016-223426; dated May 19, 2020.
Taiwanese Office Action corresponding to TW Patent Application No. 106131940, dated Mar. 27, 2020.

* cited by examiner

*Primary Examiner* — Long Pham
(74) *Attorney, Agent, or Firm* — Cantor Colburn LLP (57) ABSTRACT

A compound semiconductor device includes a first transistor formed on a GaN epitaxial layer. The first transistor includes a gate electrode, a source electrode, a drain electrode, and a protective film covering them. End portions of the first transistor do not overhang the protective film, and the concentration of fluorine in the GaN epitaxial layer in the region where the gate electrode of the first transistor is formed is substantially zero.

6 Claims, 10 Drawing Sheets

COMPOUND SEMICONDUCTOR DEVICE

CROSS REFERENCE TO RELATED APPLICATIONS

The present invention claims priority under 35 U.S.C. § 119 to Japanese Patent Application No. 2016-223426 filed on Nov. 16, 2016, the entire content of which are incorporated herein by reference.

BACKGROUND OF THE INVENTION

1. Field of the Invention

The present invention relates to a compound semiconductor device.

2. Description of the Related Art

In recent years, compound semiconductor devices capable of high-speed operations have been under development. Gallium nitride (GaN) based devices have been adopted for radio frequency (RF) circuits, in particular. For example, RF switch integrated circuits (ICs) are required to have low distortion characteristics.

Figure 1:
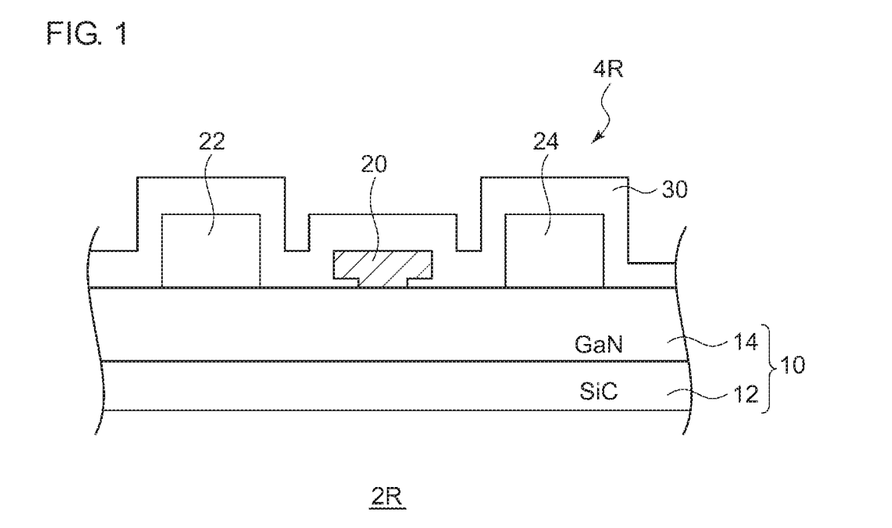
FIG. 1 is a sectional view of a conventional GaN based semiconductor device.

FIG. 1 is a sectional view of a conventional GaN based semiconductor device. A compound semiconductor device 2 in FIG. 1 includes a GaN substrate 10 and a high electron mobility transistor (HEMT) (to be simply referred to as a transistor hereinafter) 4 with a Schottky gate structure formed on the GaN substrate 10. The transistor 4 includes a gate electrode 20, a source electrode 22, a drain electrode 24, and a protective film 30 covering them. The GaN substrate 10 includes a growth substrate 12 made of silicon (Si), silicon carbide (SiC), sapphire, or the like and an epitaxial layer 14 that contains GaN and is formed on the growth substrate 12. The epitaxial layer 14 includes a buffer layer, an electron transit layer, a spacer layer, and an electron supply layer.

In order to implement low distortion characteristics, the compound semiconductor device 2 in FIG. 1 is manufactured by the following process.

After the source electrode 22 and the drain electrode 24 are formed, the protective film 30 made of silicon nitride (SiN), silicon dioxide ($SiO_2$), or the like is formed. Subsequently, the gate regions of the protective film 30 are dry-etched by using a fluorine gas (for example, $CF_4$ or $SF_6$) to uncover the epitaxial layer 14. The gate electrode 20 made of nickel/silver (Ni/Au) is formed in each gate region. The gate electrode 20 has a T-shaped cross-section, and has end portions overhanging the protective film 30.

This structure can relax electric field concentrations at the end portions of each gate electrode 20 and reduce current collapse and gate leak currents. Japanese Patent Laid-Open No. 2014-011292 discloses a technique of further reducing gate leak currents by using tantalum oxide nitride (TaON) for the protective film 30.

When a device structure in FIG. 1 is used, fluorine (F) is implanted into the surface of the epitaxial layer 14 at a concentration of about $2\times10^{17}$ $cm^{-3}$ in a dry etching process for the protective film 30. Applying a voltage to the transistor 4 at the time of its operation will move ionized fluorine (F), which is accompanied by changes in potential, thus posing the problem of fluctuations in gate threshold voltage $V_{GS(th)}$ and leak current. In addition, fluctuating time constants often differ for the respective wafers, thus posing a problem in terms of manufacturing stability.

SUMMARY OF THE INVENTION

The present invention has been made inconsideration of the above problems, and an exemplary object of an aspect of the invention is to provide a compound semiconductor device including a transistor in which fluctuations in the gate threshold voltage $V_{GS(th)}$ are suppressed.

An aspect of the present invention relates to a compound semiconductor device. The compound semiconductor device includes a first transistor that is formed on a GaN epitaxial layer. The first transistor includes a gate electrode, a source electrode, a drain electrode, and a protective film covering them, end portions of the gate electrode of the first transistor do not overhang the protective film, and the concentration of fluorine in the GaN epitaxial layer is substantially zero in a region where the gate electrode of the first transistor is formed.

According to this aspect, no overhangs need to be formed at end portions of the gate electrode, and hence there is no need to perform dry etching using a fluorine gas in the manufacturing process. This can prevent fluorine from being implanted into the GaN epitaxial layer, thereby suppressing fluctuations in the gate threshold $V_{GS(th)}$.

The protective film may include tantalum oxide nitride. This can reduce gate leak currents.

The compound semiconductor device may further include a second transistor formed on the GaN epitaxial layer. The second transistor may include a gate electrode, a source electrode, a drain electrode, and a protective film covering them, end portions of the gate electrode of the second transistor may overhang the protective film, and fluorine may exist in the GaN epitaxial layer in a region where the gate electrode of the second transistor is formed.

The compound semiconductor device may include a switch provided on a path through which an RF signal propagates and a logic circuit that controls the switch. The logic circuit may be formed from the first transistor. The switch may be formed from the second transistor.

Another aspect of the present invention is a manufacturing method. This method is a method of manufacturing a compound semiconductor device, and includes forming a first transistor. The forming the first transistor includes forming a source electrode and a drain electrode, forming a resist layer in which a gate region is opened, vapor-depositing a metal, removing the resist layer to form a gate electrode, and forming a protective film.

According to this aspect, there is no need to perform dry etching using a fluorine gas in the manufacturing process. This can prevent fluorine from being implanted into the GaN epitaxial layer, thereby suppressing fluctuations in the gate threshold $V_{GS(th)}$.

Still another aspect of the present invention relates to a method of manufacturing a compound semiconductor device including a first transistor and a second transistor. This manufacturing method includes forming a source electrode and a drain electrode for each of the first transistor and the second transistor, forming a first resist layer in which a gate region of the first transistor is opened, vapor-depositing a metal, removing the first resist layer to form a gate electrode of the first transistor, forming a protective film, forming, on the protective film, a second resist layer in which a gate region of the second transistor is opened, etching a portion of the protective film which corresponds to an opening of the second resist layer, removing the second resist layer, forming a third resist layer having an opening conforming to a shape of the gate electrode of the second transistor, vapor-depositing a metal, and removing the third resist layer to form a gate electrode of the second transistor.

According to this aspect, the first transistor in which fluctuations in the gate threshold VGS(th) are suppressed and the second transistor in which gate leak currents and current collapse are reduced and suppressed can be easily integrated on the same GaN epitaxial substrate.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

For the sake of easy understanding, the dimensions (thickness, length, width, and the like) of each member illustrated in the accompanying drawings are sometimes enlarged or reduced as needed. In addition, the dimensions of a plurality of members do not necessarily represent their magnitude relationship. Even if a given member A is drawn thicker than another member B in a given drawing, the member A can be thinner than the member B.

First Embodiment

Figure 2:
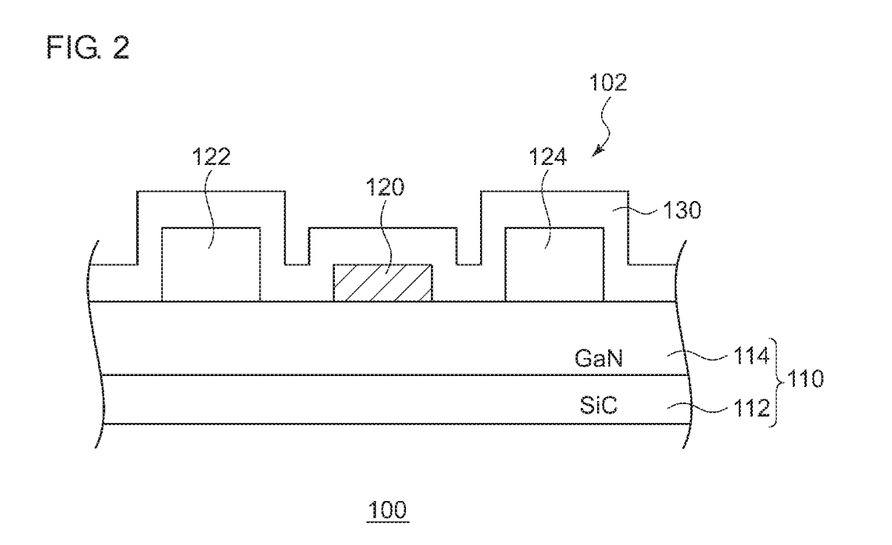
FIG. 2 is a sectional view of a semiconductor device according to the first embodiment.

FIG. 2 is a sectional view of a semiconductor device 100 according to the first embodiment. The semiconductor device 100 includes a high electron mobility transistor (HEMT) with a Schottky gate structure (to be simply referred to as a first transistor hereinafter) 102.

A GaN substrate 110 is an epitaxial substrate, which includes a single crystal growth substrate 112 made of, for example, silicon (Si), silicon carbide (SiC), sapphire, gallium nitride (GaN), gallium arsenide (GaAs), or the like and a GaN epitaxial layer 114 formed on the growth substrate 112. The GaN epitaxial layer 114 includes a buffer layer, an electron transit layer, a spacer layer, and an electron supply layer. FIG. 2 does not illustrate these layers.

The first transistor 102 includes a gate electrode 120, a source electrode 122, and a drain electrode 124, which are formed on the GaN epitaxial layer 114, and a protective film 130 covering them. Ohmic contacts are formed between the source electrode 122 and the GaN epitaxial layer 114 and between the drain electrode 124 and the GaN epitaxial layer 114. The protective film 130 is formed mainly to prevent the aluminum (Al) contained in the GaN epitaxial layer 114 from being oxidized.

End portions of the gate electrode 120 of the first transistor 102 do not overhang the protective film 130. In other words, the first transistor 102 has no eaves overhanging the protective film 130. In addition, in the region where the gate electrode 120 is formed, the concentration of fluorine in the GaN epitaxial layer 114 is substantially zero. That "the concentration of fluorine is substantially zero" includes that the concentration of fluorine is at a level equal to or less than the detection limit or close to it. For example, the lower detection limit for fluorine in a GaN epitaxial layer in secondary ion mass spectrometry (SIMS), which is an impurity analysis technique, is $5 \times 10^{15}$ cm$^{-3}$. In this embodiment, therefore, the concentration of fluorine may be $5 \times 10^{15}$ cm$^{-3}$ or less.

Although materials for each electrode and the protective film are not specifically limited, for example, the gate electrode 120 is made of nickel/silver (Ni/Au) or the like, and the source electrode 122 and the drain electrode 124 can contain at least one of the following: nickel (Ni), platinum (Pt), gold (Au), molybdenum (Mo), aluminum (Al), and titanium (Ti). In addition, the protective film 130 is preferably made of TaON. Note that a silicon nitride (SiN) or silicon dioxide (SiO$_2$) film can be used as the protective film 130.

The above is the structure of the semiconductor device 100. The advantages of this structure will be described subsequently.

The semiconductor device 100 is not required to form any overhangs on end portions of the gate electrode 120. This eliminates the necessity to perform any dry etching using a fluorine-based gas in a manufacturing process. This makes it possible to prevent fluorine from being implanted into the GaN epitaxial layer 114 and suppress fluctuations in a gate threshold voltage $V_{GS(th)}$.

Figure 3:
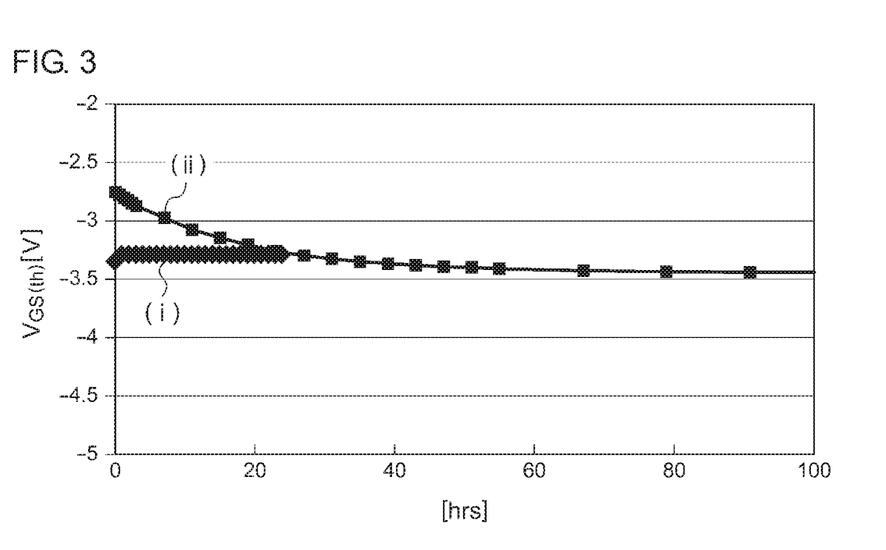
FIG. 3 is a graph illustrating the fluctuation characteristics of a gate threshold $V_{GS(th)}$ of a first transistor in FIG. 2 at the time of high-temperature energization.

FIG. 3 is a graph illustrating the fluctuation characteristics of the gate threshold $V_{GS(th)}$ of the first transistor 102 in FIG. 2 at the time of high-temperature energization. Note that plot (i) represents the fluctuation characteristics of the gate threshold $V_{GS(th)}$ of the first transistor 102 in FIG. 2, and plot (ii) represents those of the transistor 4 in FIG. 1. The first transistor 102 is of a depletion type, whose gate threshold $V_{GS(th)}$ is −3.3 V. As is obvious from FIG. 3, in the device structure in FIG. 2, fluctuations in the initial value of the gate threshold $V_{GS(th)}$ with zero use time are suppressed. In addition, the gate threshold $V_{GS(th)}$ is stable regardless of elapsed time.

Figure 4A:
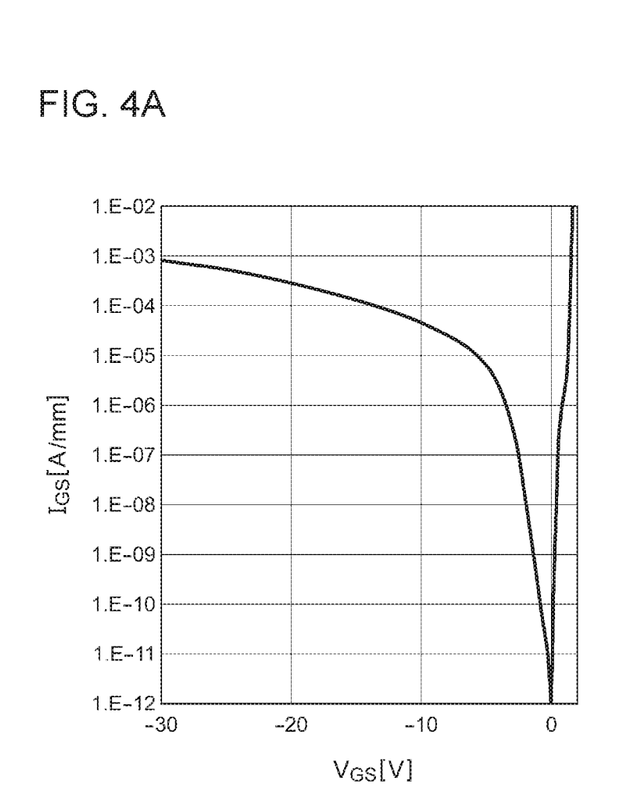
FIGS. 4A and 4B are graphs illustrating $I_{GS}$-$V_{GS}$ characteristics.
Figure 4B:
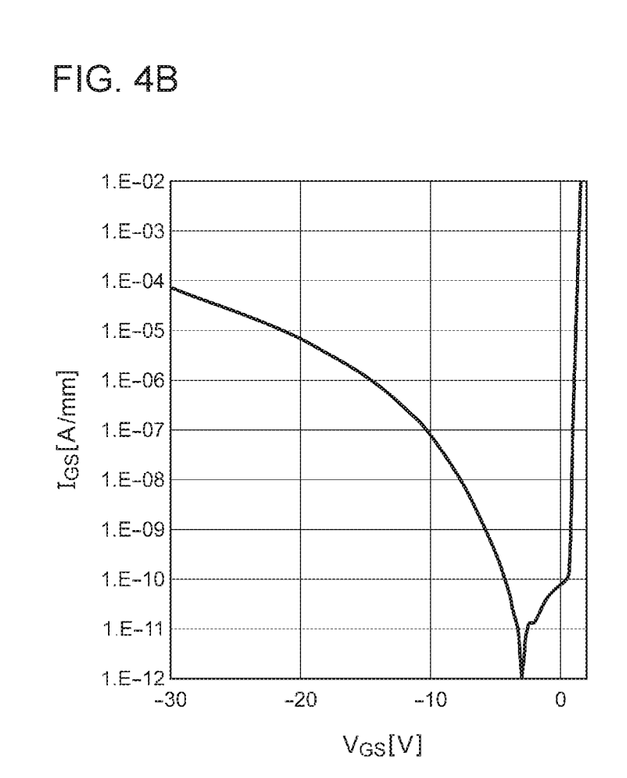

FIGS. 4A and 4B are graphs illustrating the $I_{GS}$-$I_{GS}$ characteristics. FIG. 4A illustrates the characteristics when an SiN film is used as the protective film 130. FIG. 4B illustrates the characteristics when a TaON film is used as the protective film 130. A current $I_{GS}$ in the range of $V_{GS} < V_{GS(th)}$ (that is, $V_{GS} < -3.3$ V) is a gate leak current. When a material containing Si, such as SiN or $SiO_2$, is used for the protective film 130, Ni in a gate electrode 20 is silicided at the time of forming a protective film or subsequent heat treatment. The formation of Ni silicide leads to a decrease in Schottky barrier, thus increasing the leak current by about one order of magnitude. Using a TaON film as the protective film 130 can suppress the formation of Ni silicide. This makes it possible to reduce the leak current by one order of magnitude as compared with when an SiN or $SiO_2$ film is used.

Note that the first transistor 102 is larger in gate leak current and current collapse than the transistor 4 in FIG. 1. This is because the gate electrode 120 of the first transistor 102 does not have any overhangs like those of the gate electrode 20 in FIG. 1, and hence electric field concentration tends to occur at the two ends of the gate electrode 120. That is, the first transistor 102 is suitable for a circuit block required to suppress fluctuations in the gate threshold $V_{GS(th)}$ rather than to have low gate leak current characteristics.

Figure 5A:
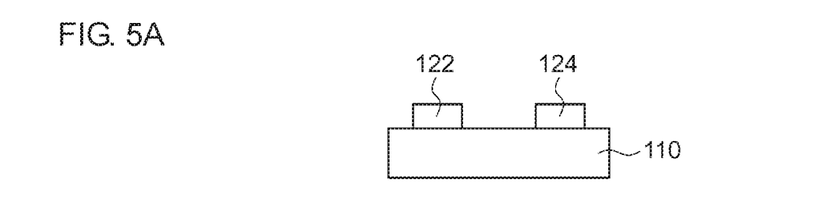
FIGS. 5A to 5E are sectional views illustrating a method of manufacturing the semiconductor device in FIG. 2.
Figure 5B:
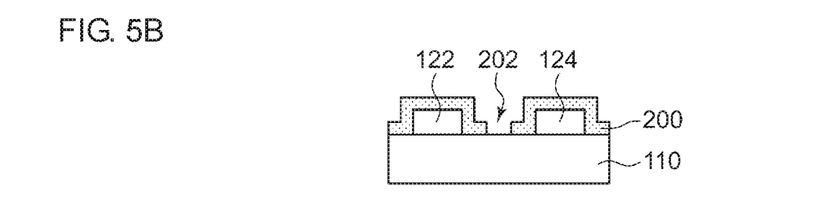
Figure 5C:
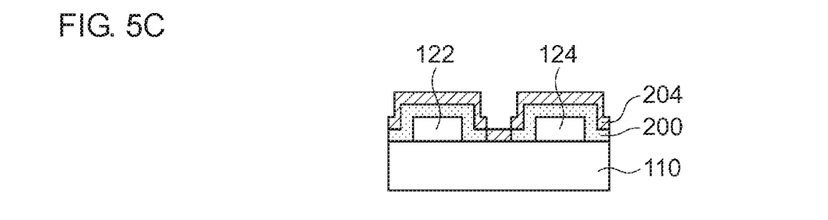
Figure 5D:
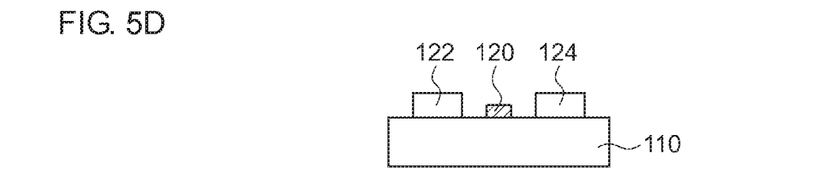
Figure 5E:
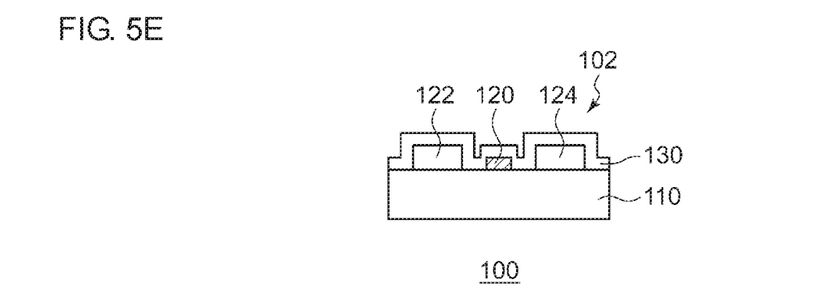

A method of manufacturing the semiconductor device 100 will be described subsequently. FIGS. 5A to 5E are sectional views illustrating the method of manufacturing the semiconductor device 100 in FIG. 2. Referring to FIG. 5A, the source electrode 122 and the drain electrode 124 are formed on the GaN substrate 110. As illustrated in FIG. 5B, a resist layer 200 having an opening 202 is then formed in the gate region of a transistor by photolithography. As illustrated in FIG. 5C, a metal 204 such as Ni/Au is vapor-deposited on the resist layer 200. Subsequently, as illustrated in FIG. 5D, the resist layer 200 is removed (gate liftoff) together with the metal 204 by resist ashing, and the gate electrode 120 is formed on a portion of the opening 202. As illustrated in FIG. 5E, the protective film 130 made of TaON is then formed by sputtering through plasma cleaning, thereby forming the first transistor 102.

This manufacturing method can suppress fluctuations in the gate threshold $V_{GS(th)}$ because no fluorine is implanted into the gate region of the first transistor 102 in a dry etching process using a fluorine gas such as $SF_6$.

Second Embodiment

As described above, the first transistor 102 is excellent in the stability of the gate threshold $V_{GS(th)}$ but is inferior in gate leak current characteristics to the transistor 4 in FIG. 1. The second embodiment will exemplify a semiconductor device 100A obtained by integrating, on one semiconductor chip, a transistor (first transistor) required to have stability in terms of a gate threshold $V_{GS(th)}$ and a transistor (second transistor) required to have low gate leak current characteristics and low current collapse characteristics.

Figure 6:
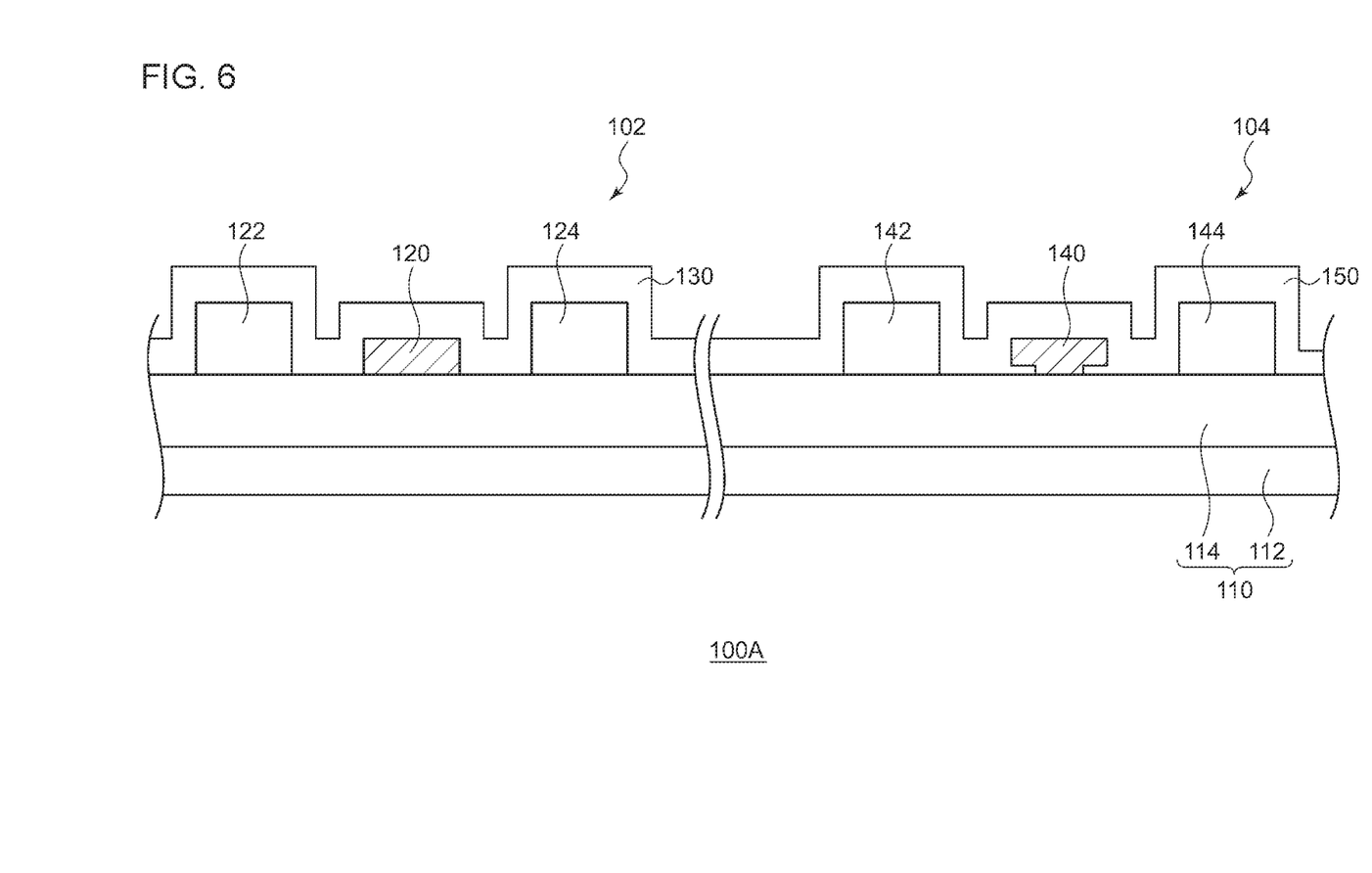
FIG. 6 is a sectional view of a semiconductor device according to the second embodiment.

FIG. 6 is a sectional view of the semiconductor device 100A according to the second embodiment. The semiconductor device 100A includes a first transistor 102 and a second transistor 104, each having a Schottky structure. Note that FIG. 6 does not intend to indicate that the first transistor 102 and the second transistor 104 are arranged adjacent to each other.

The device structure of the first transistor 102 is the same as that illustrated in FIG. 2. The second transistor 104 includes a gate electrode 140, a source electrode 142, a drain electrode 144, and a protective film 150 covering them. The gate electrode 140 of the second transistor 104 has end portions overhanging the protective film 150. In the region where the gate electrode 140 of the second transistor 104 is formed, fluorine exists in a GaN epitaxial layer 114.

The above is the structure of the semiconductor device 100A. The first transistor 102 is excellent in the stability of the gate threshold $V_{GS(th)}$, as described above. The second transistor 104 is excellent in gate leak current characteristics and current collapse characteristics because the overhang structure of the gate electrode 140 relaxes electric field concentration. The first transistor 102 and the second transistor 104 having different characteristics are integrated on one semiconductor chip (die), and a proper transistor type is selected for each circuit block of the semiconductor device 100A or each device, thereby improving the performance, function, and reliability of the semiconductor device 100A.

A method of manufacturing the semiconductor device 100A in FIG. 6 will be described subsequently. FIGS. 7A to 7E and FIGS. 8A to 8F are sectional views illustrating the method of manufacturing the semiconductor device 100A in FIG. 6.

Figure 7A:
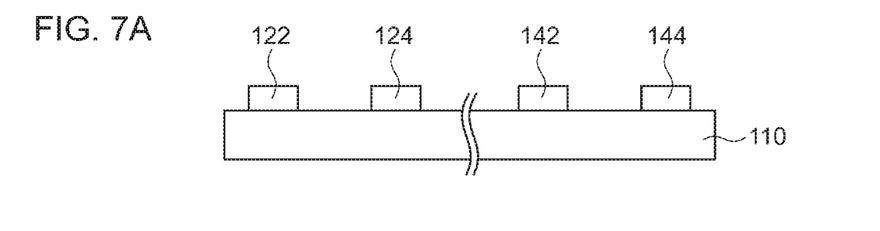
FIGS. 7A to 7E are sectional views illustrating a method of manufacturing the semiconductor device in FIG. 6.

FIGS. 7A to 7E mainly illustrate a formation process for the first transistor 102. Referring to FIG. 7A, a source electrode 122 and a drain electrode 124 of the first transistor 102 are formed on a GaN substrate 110, together with the source electrode 142 and the drain electrode 144 of the second transistor 104.

Figure 7B:
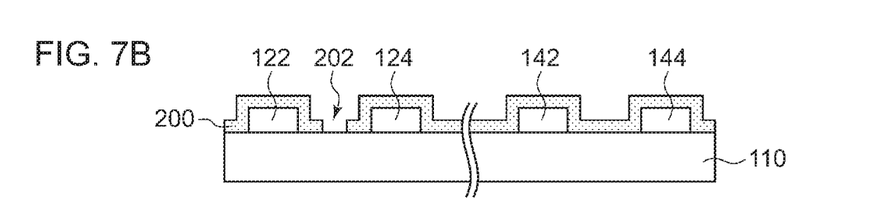
Figure 7C:
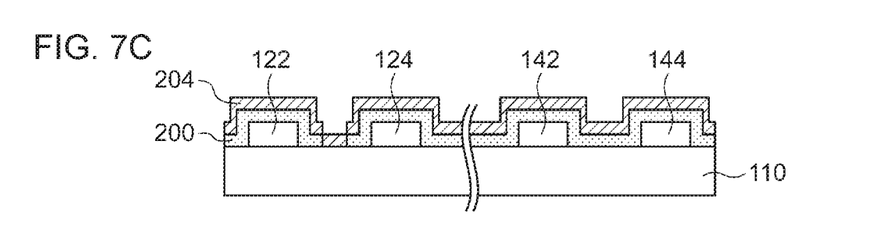
Figure 7D:
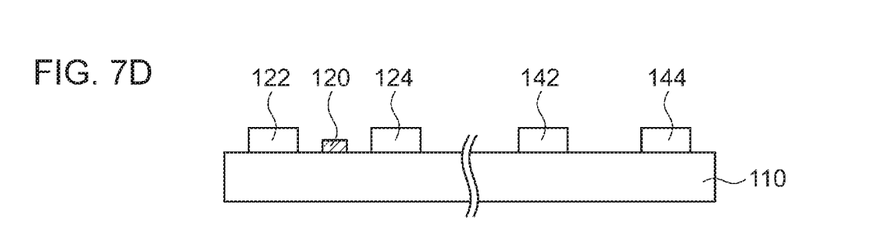
Figure 7E:
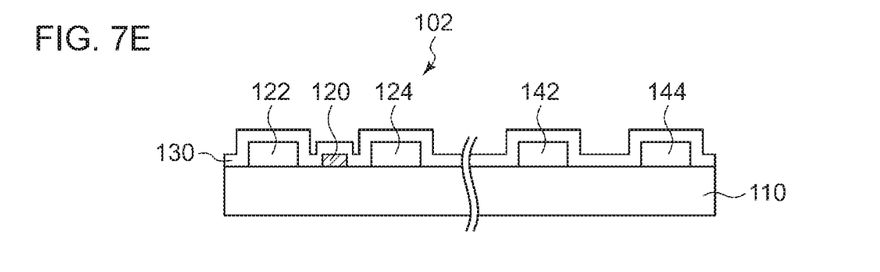

Subsequently, as illustrated in FIG. 7B, a first resist layer 200 having an opening 202 is formed in the gate region of the first transistor 102 by photolithography. As illustrated in FIG. 7C, a metal 204 such as Ni/Au is then vapor-deposited on the first resist layer 200. As illustrated in FIG. 7D, the first resist layer 200 is then removed by resist ashing to form a gate electrode 120 at a portion of the opening 202. Subsequently, as illustrated in FIG. 7E, a protective film 130 made of TaON is formed by sputtering through plasma cleaning, thereby forming the first transistor 102. The protective film 130 formed at this time also serves as the protective film 150 covering the second transistor 104.

Figure 8A:
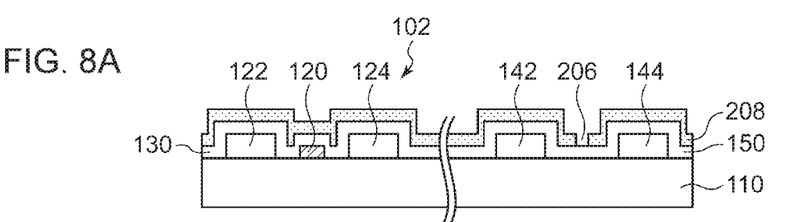
FIGS. 8A to 8F are sectional views illustrating a method of manufacturing the semiconductor device in FIG. 6.
Figure 8B:
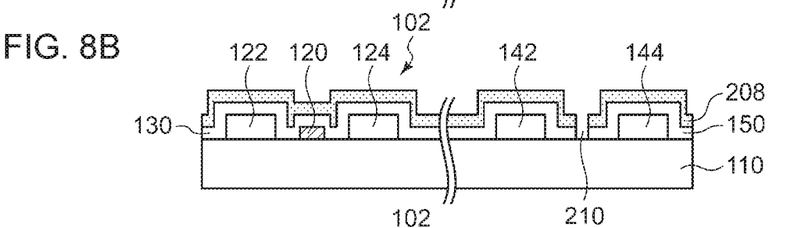
Figure 8C:
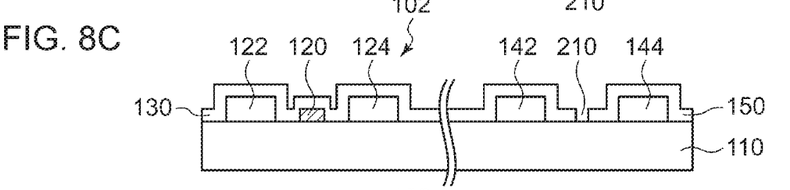
Figure 8D:
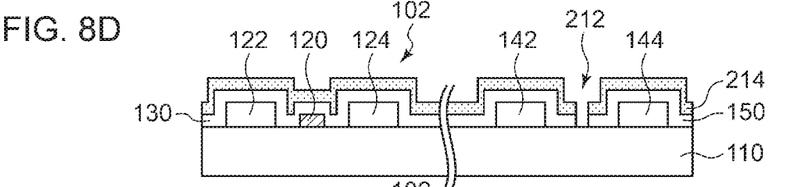
Figure 8E:
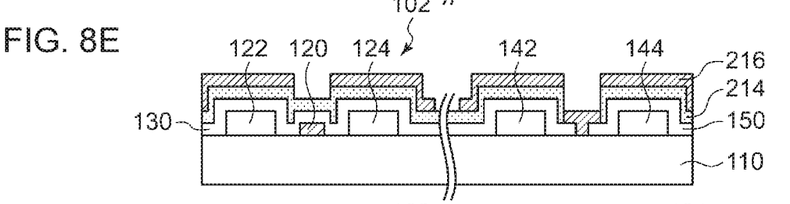
Figure 8F:
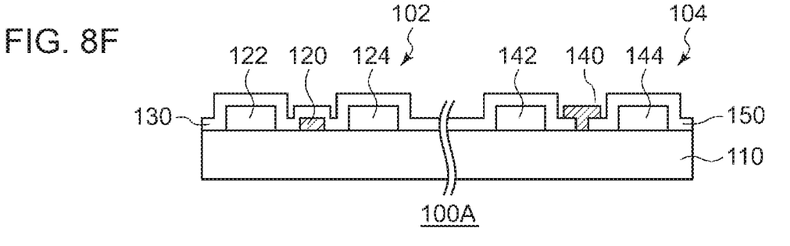

A formation process for the second transistor 104 will be described with reference to FIGS. 8A to 8F. As illustrated in FIG. 8A, a second resist layer 208 having an opening 206 is formed on the protective film 150 in the gate region of the second transistor 104. Subsequently, that portion of the protective film 150 which corresponds to the opening 206 of the second resist layer 208 is plasma-etched by using a fluorine gas such as $SF_6$. This forms an opening 210 in the protective 150. As illustrated in FIG. 8C, the second resist layer 208 is then removed. Referring to FIG. 8D, a third resist layer 214 having an opening 212 conforming to the shape of the gate electrode of the second transistor 104 is formed. Subsequently, as illustrated in FIG. 8E, a metal 216 such as Ni/Au is vapor-deposited on the third resist layer 214. As illustrated in FIG. 8F, the third resist layer 214 is removed (liftoff) together with the metal 216, and the gate electrode 140 of the second transistor 104 is formed. The upper surface of the gate electrode 140 may be covered with a protective film (not illustrated), as needed.

Appropriate cleaning processes may be inserted between the respective steps, as needed.

The above is the method manufacturing the semiconductor device 100A. This manufacturing method can form two transistors having different performances on the same semiconductor chip.

<Application>

Figure 9:
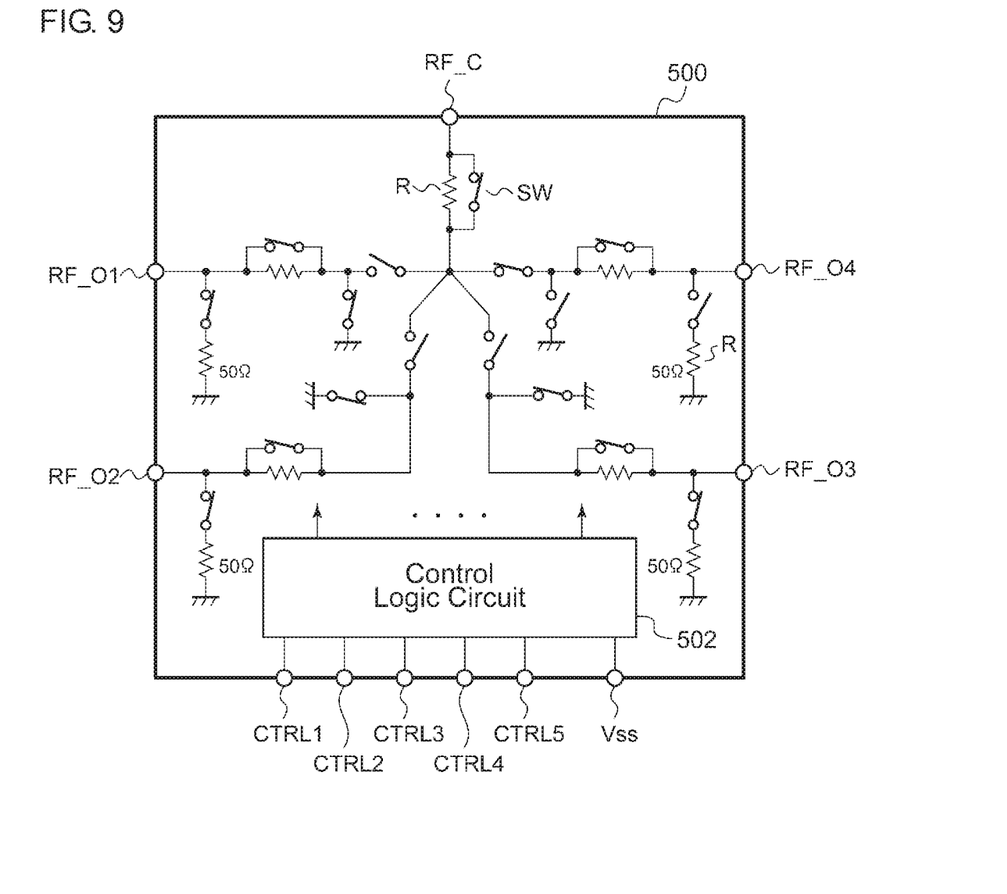
FIG. 9 is a circuit block diagram illustrating an example of an RF circuit.

An application of the semiconductor device 100A will be described subsequently. The semiconductor device 100 in FIG. 2 or the semiconductor device 100A in FIG. 6 can be suitably used for an RF circuit (monolithic microwave IC (MMIC)). FIG. 9 is a circuit block diagram illustrating an example of an RF circuit 500.

The RF circuit 500 includes an input port RF_C, a plurality of output ports RF_O1 to RF_O4, a plurality of control pins CTRL1 to CTRL5, a power supply pin Vss, a plurality of switches SW, a plurality of resistors R, and a control logic circuit 502. A negative power supply voltage is supplied to the power supply pin Vss. The RF circuit 500 can switch between a switch mode and a splitter mode. In the switch mode, the RF circuit 500 outputs the RF signal input to the input port RF_C to one of the four output ports RF_O1 to RF_O4 which is selected in accordance with the electrical states of the control pins CTRL1 to CTRL5. That is, in the switch mode, the RF circuit 500 functions as a single pole 4 throw (SP4T) switch.

In the splitter mode, the RF circuit 500 outputs the RF signal input to the input port RF_C to a plurality (two, three, or four) of control pins of the four output ports RF_O1 to RF_O4 which are selected in accordance with the states of the control pins CTRL1 to CTRL5. That is, in the splitter mode, the RF circuit 500 functions as a two- to four-branch splitter (branching filter). The plurality of resistors R is provided for impedance matching.

Control signals for designating operation modes and output destination ports are input to the control pins CTRL1 to CTRL5. The control logic circuit 502 generates gate signals for the respective switches SW to turn on and off them on the basis of the electrical states of the control pins CTRL1 to CTRL5.

In the RF circuit 500 having such a structure, because the plurality of switches SW, through which RF signals pass, influences the distortion characteristics of the RF signals, and hence smaller gate leak currents are preferable. Accordingly, each of the plurality of switches SW is preferably formed from the first transistor 102.

It is to be understood by a person skilled in the art that the topologies of the plurality of switches SW and a plurality of resistors are not limited to those illustrated in FIG. 9, and can be designed in accordance with the number of output ports and the function of the RF circuit 500.

According to this embodiment, each of the plurality of switches SW has the device structure of the first transistor 102, and each of the transistors constituting the control logic circuit 502 has the device structure of the second transistor 104.

Figure 10:
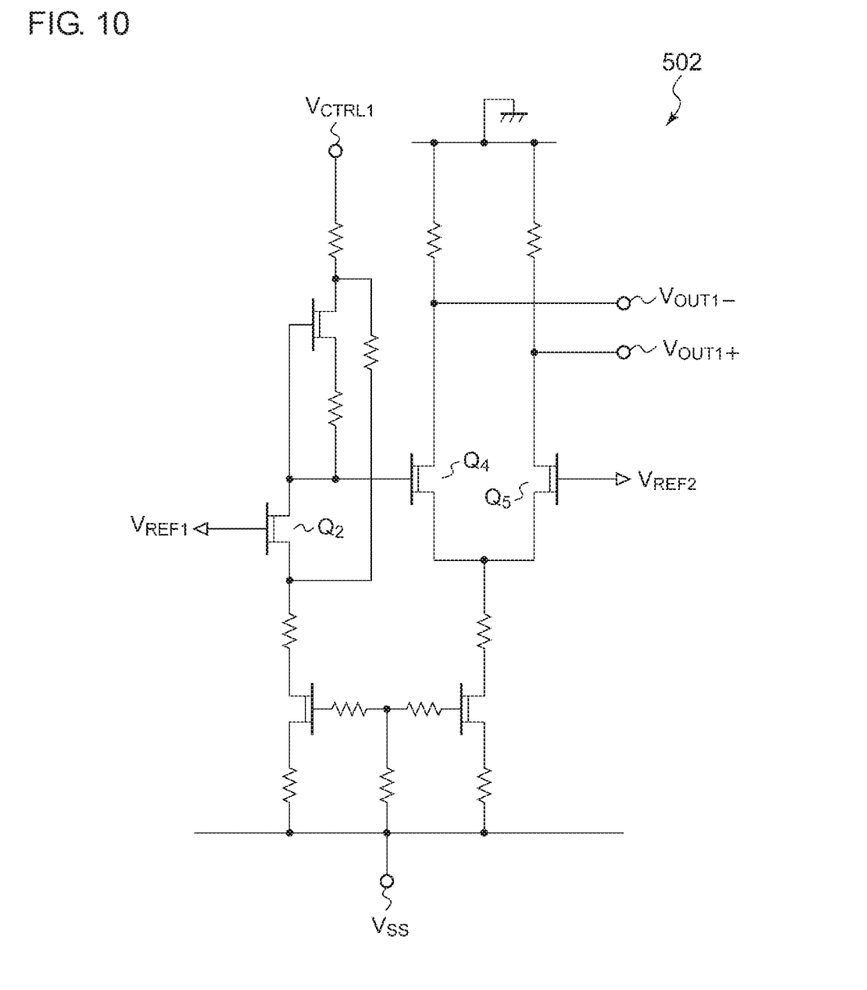
FIG. 10 is a circuit diagram illustrating an example of the arrangement of a control logic circuit.

FIG. 10 is a circuit diagram illustrating an example of the arrangement of the control logic circuit 502. Upon receiving a control voltage $V_{CTRL1}$ input to the control pin CTRL1, the control logic circuit 502 generates differential outputs $V_{OUT1+}$ and $V_{OUT1-}$. The control pins CTRL2 to CTRL5 are configured in the same manner as described above. The output voltages $V_{OUT1+}$ and $V_{OUT1-}$ are supplied to the gate electrodes of some of the plurality of switches SW in FIG. 9.

Problems that can occur in the RF circuit 500 will be described subsequently with reference to FIG. 11.

Figure 11:
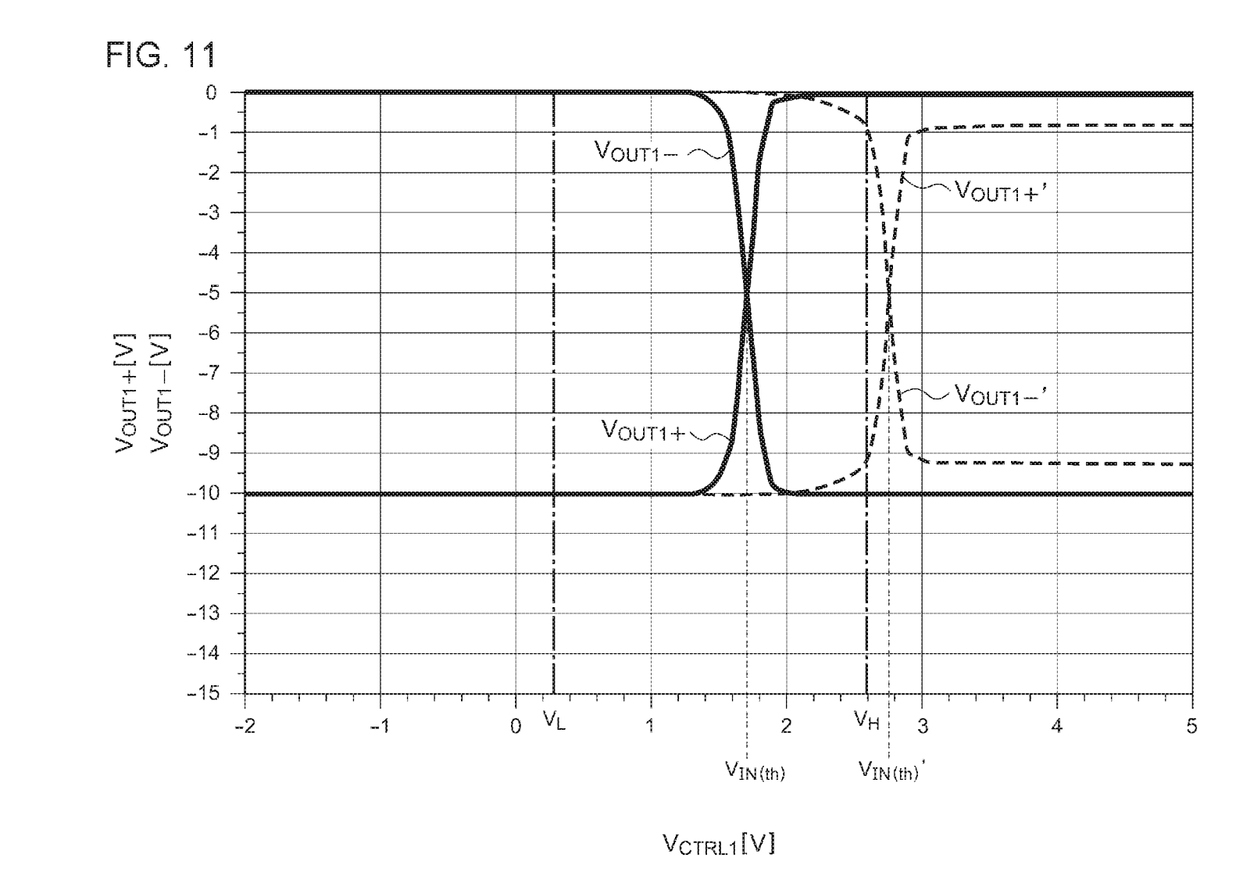
FIG. 11 is a graph illustrating the input/output characteristics of the control logic circuit in FIG. 10.

FIG. 11 is a graph illustrating the input/output characteristics of the control logic circuit 502 in FIG. 10. For example, a threshold $V_{IN(th)}$ for the control voltage $V_{CTRL1}$ is about 1.8 V, and changes in the switching range between a high level voltage $V_H$ (for example, 2.6 V) and a low level voltage $V_L$ (for example, 0.3 V). $V_{OUT1+}$ and $V_{OUT1-}$ represent characteristics when the gate threshold $V_{GS(th)}$ of each of all the transistors of the control logic circuit 502 is a rated value. When $V_{CTRL1}$=0.3 V, $V_{OUT1-}$ is 0 V, and $V_{OUT1+}$ is −10 V. When $V_{CTRL1}$=2.6 V, $V_{OUT1-}$ is 10 V (low level), and $V_{OUT1+}$ is 0 V (high level).

$V_{OUT1+}'$ and $V_{OUT1-}'$ represented by the chain lines represent the input/output characteristics when the gate threshold $V_{GS(th)}$ of each of transistors Q2, Q4, and Q5 has shifted by 1 V in the negative direction. As the gate threshold $V_{GS(th)}$ fluctuates, the threshold $V_{IN(th)}$ for the control voltage $V_{CTRL1}$ shifts to 2.8 V. As a result, when the control voltage $V_{CTRL1}$ is at the high level voltage $V_H$ (2.6 V), $V_{OUT1-}'$ becomes −2 V (high level), and $V_{OUT1+}'$ becomes −9 V (low level), thus failing to output correct logical values.

As an approach to solve this problem, it is conceivable to define the high level voltage $V_H$ of the control voltage $V_{CTRL1}$ to be higher than 3 V. In this case, although correct logical values can be generated, when $V_{CTRL1}$=3 V, $V_{OUT1-}'$ becomes −9 V, which is higher by 1 V than $V_{OUT1-}$=−10 V when the gate threshold $V_{GS(th)}$ is a rated value. This degrades the stability of the OFF state of each transistor (each switch in FIG. 9) to which the voltage $V_{OUT1-}'$ is supplied, thus degrading the distortion characteristics.

According to a conventional architecture, in order to implement good distortion characteristics, each of a plurality of switches SW needs to be formed from the transistor 4 in FIG. 1, and each transistor constituting the control logic circuit 502 also has the same device structure as that of the transistor 4. This makes it inevitable for each transistor constituting the control logic circuit 502 to suffer from fluctuations in the gate threshold $V_{GS(th)}$, thus posing the problem of the inability to correctly control each switch SW or degradation in distortion characteristics.

In contrast to the above, in this embodiment, each transistor constituting the control logic circuit 502 has the same device structure as that of the second transistor 104, and hence it is possible to suppress fluctuations in the gate threshold $V_{GS(th)}$. This makes it possible to suppress fluctuations in the voltages $V_{OUT1+}$ and $V_{OUT1-}$ supplied to each switch SW, and hence to correctly control the switch SW and improve the distortion characteristics.

<Modification>

The applications of the semiconductor devices 100 and 100A according to the embodiments are not limited to switches, selectors, and RF circuits (MMICs) having split functions, but these devices can also be applied to high-frequency amplifiers. The devices can also be applied to power ICs instead of high-frequency ICs.

While the preferred embodiments of the present invention have been described using specific terms, such description is for illustrative purposes only, and it is to be understood that changes and variations may be made without departing from the spirit or scope of the appended claims.

What is claimed is:

1. A compound semiconductor device comprising a first transistor that is formed on a GaN epitaxial layer and a second transistor formed on the GaN epitaxial layer, wherein the first transistor includes a gate electrode, a source electrode, a drain electrode, and a protective film covering a top surface of the gate electrode, the source electrode, and the drain electrode, an end portion of the gate electrode of the first transistor does not overhang the protective film, and a concentration of fluorine in the GaN epitaxial layer is substantially zero in a region where the gate electrode of the first transistor is formed;

wherein the protective film is formed after the gate electrode is formed;
the protective film is formed directly on the gate electrode, the source electrode, and the drain electrode, and
the second transistor includes a gate electrode, a source electrode, a drain electrode, and a protective film covering at least the source electrode and the drain electrode, an end portion of the gate electrode of the second transistor overhangs the protective film, and fluorine exists in the GaN epitaxial layer in a region where the gate electrode of the second transistor is formed.

2. The compound semiconductor device according to claim 1, wherein the protective film includes tantalum oxide nitride.

3. A compound semiconductor device comprising a first transistor that is formed on a GaN epitaxial layer and a second transistor formed on the GaN epitaxial layer,
wherein the first transistor includes a gate electrode, a source electrode, a drain electrode, and a protective film covering a top surface of the gate electrode, the source electrode, and the drain electrode, an end portion of the gate electrode of the first transistor does not overhang the protective film, and a concentration of fluorine in the GaN epitaxial layer is substantially zero in a region where the gate electrode of the first transistor is formed, wherein the protective film is formed after the gate electrode is formed,
the protective film is formed directly on the gate electrode, the source electrode, and the drain electrode,
the protective film includes tantalum oxide nitride, and
the second transistor includes a gate electrode, a source electrode, a drain electrode, and a protective film covering at least the source electrode and the drain electrode, an end portion of the gate electrode of the second transistor overhangs the protective film, and fluorine exists in the GaN epitaxial layer in a region where the gate electrode of the second transistor is formed.

4. The compound semiconductor device according to claim 1, further comprising:
a switch that is provided on a path through which an RF signal propagates; and
a logic circuit that controls the switch,
wherein the logic circuit comprises the first transistor, and the switch comprises the second transistor.

5. The compound semiconductor device according to claim 3, further comprising:
a switch that is provided on a path through which an RF signal propagates; and
a logic circuit that controls the switch,
wherein the logic circuit comprises the first transistor, and the switch comprises the second transistor.

6. The compound semiconductor device according to claim 1, wherein the protective layer comprises a single layer.

* * * * *